(12) United States Patent
Deguchi et al.

(10) Patent No.: US 8,451,965 B2
(45) Date of Patent: May 28, 2013

(54) SEMICONDUCTOR INTEGRATED CIRCUIT, RADIO COMMUNICATION DEVICE AND TIME TO DIGITAL CONVERTER

(75) Inventors: Jun Deguchi, Kawasaki (JP); Daisuke Miyashita, Kawasaki (JP); Hiroyuki Kobayashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 259 days.

(21) Appl. No.: 13/053,396

(22) Filed: Mar. 22, 2011

(65) Prior Publication Data

US 2012/0063520 A1 Mar. 15, 2012

(30) Foreign Application Priority Data

Sep. 13, 2010 (JP) ................................. 2010-204695

(51) Int. Cl.
| | |
|---|---|
| H03D 1/04 | (2006.01) |
| H03D 1/06 | (2006.01) |
| H03K 5/01 | (2006.01) |
| H03K 6/04 | (2006.01) |
| H04B 1/10 | (2006.01) |
| H04L 1/00 | (2006.01) |
| H04L 25/08 | (2006.01) |

(52) U.S. Cl.
USPC ............................ 375/346; 375/285; 375/316

(58) Field of Classification Search
USPC .......................................................... 375/376
See application file for complete search history.

(56) References Cited

U.S. PATENT DOCUMENTS

| 6,993,108 B1* | 1/2006 | Chi et al. ........................ 375/376 |
| 2002/0126165 A1* | 9/2002 | Adkins et al. ...................... 347/9 |

OTHER PUBLICATIONS

Le Roux et al, A 1V RF with an 863-to928MHz 400kb/s Radio and 32b Dual-MAC DSP Core for Wireless Sensor and Body Networks, ISSCC 2010, Session 25, Wireless Connectivity/25.8 pp. 464-465.

* cited by examiner

*Primary Examiner* — Erin File
(74) *Attorney, Agent, or Firm* — Turocy & Watson, LLP

(57) ABSTRACT

According to one embodiment, a semiconductor integrated device includes a digitally controlled oscillator, a counter, a time to digital converter, an adder, and a control signal generator. The time to digital converter includes a frequency-divider, a plurality of impedance elements, and a phase difference detector. The frequency-divider is configured to frequency-divide the oscillation signal to generate a plurality of frequency-divided signals. The plurality of impedance elements is configured to voltage-divide the frequency-divided signals to generate a plurality of delay signals of the oscillation signal. The phase difference detector is configured to output the third digital signal corresponding to the phase difference between the reference signal and the oscillation signal by comparing the reference signal with each of the delay signals.

16 Claims, 7 Drawing Sheets

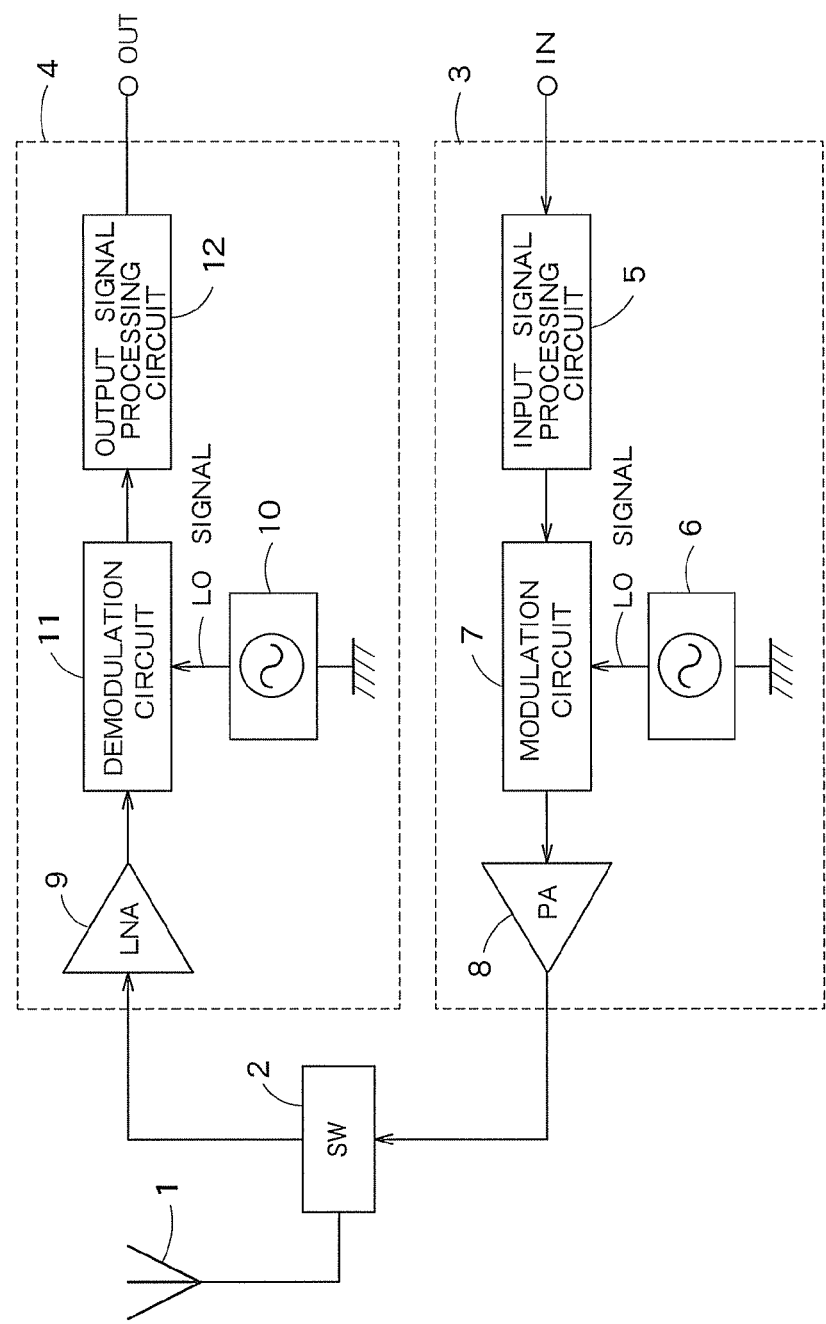
F I G. 1

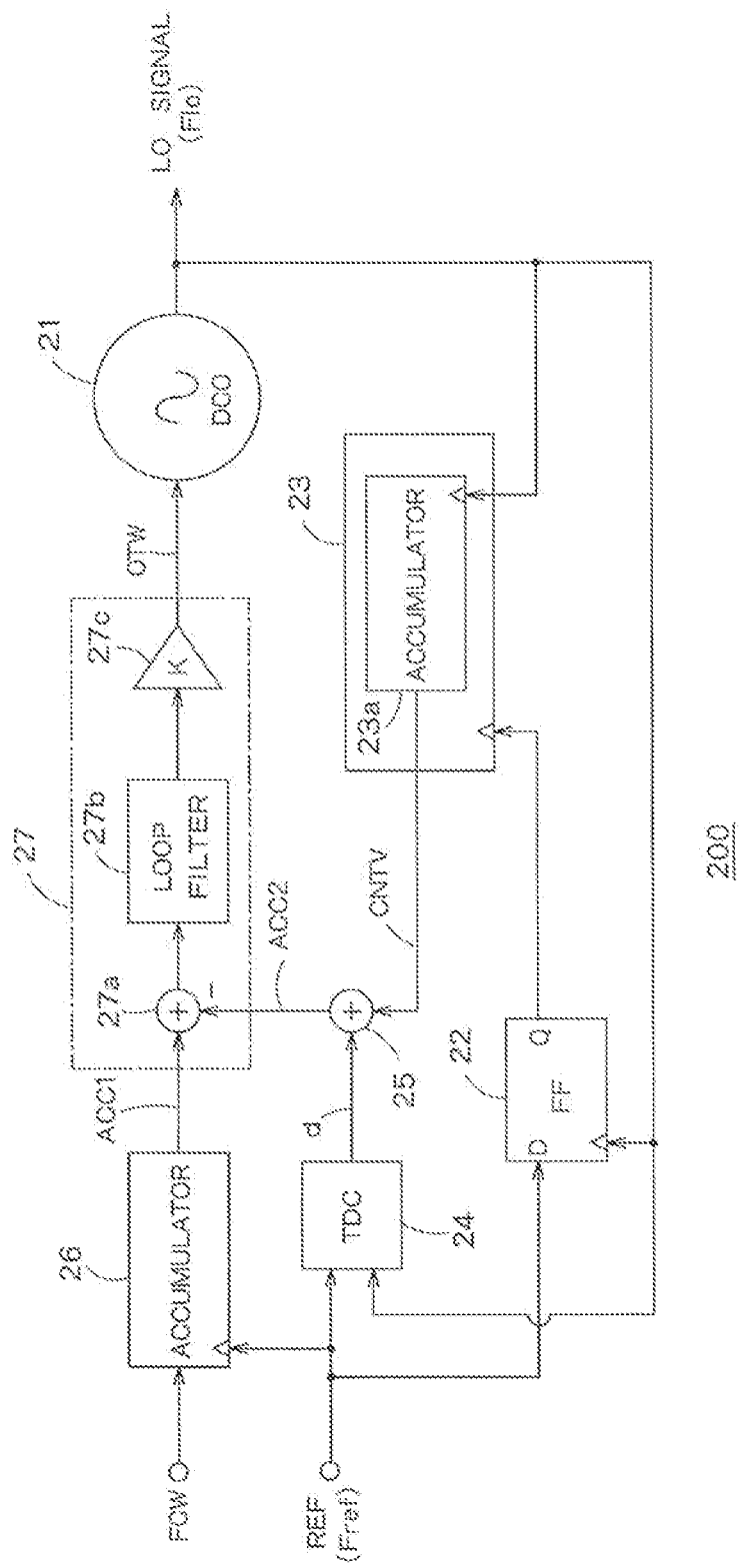
F I G. 2

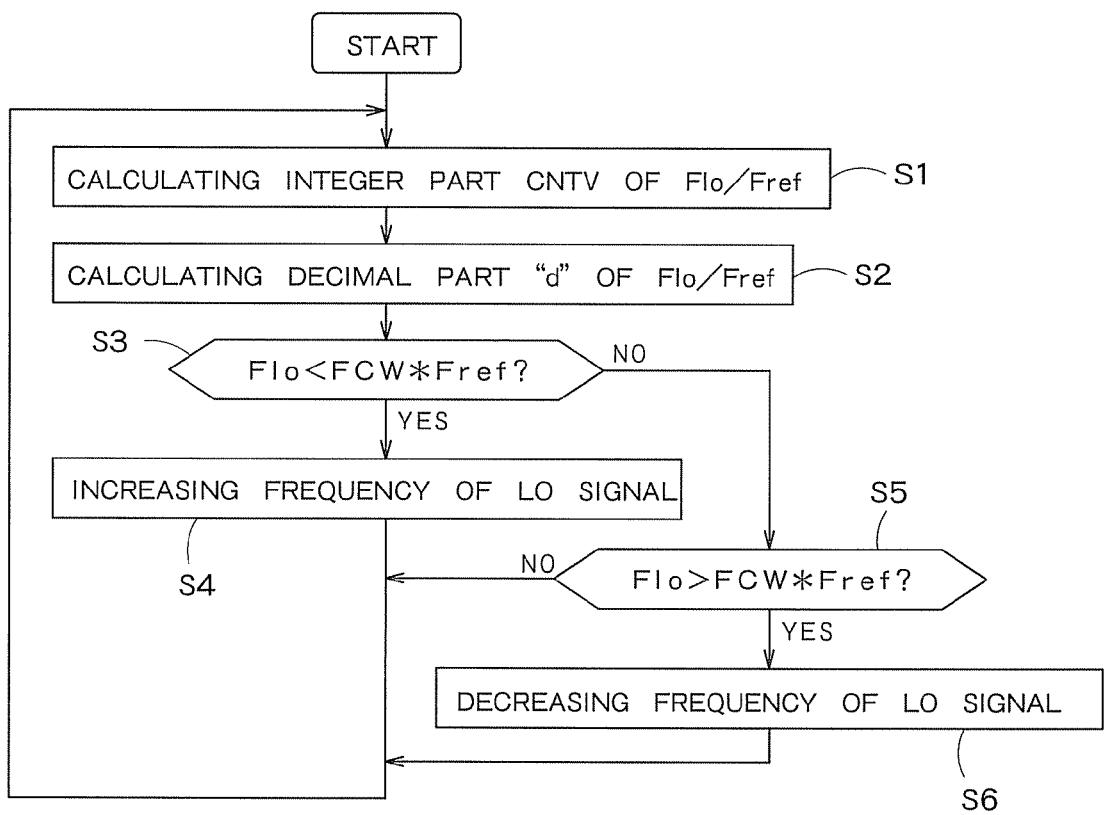
F I G. 3

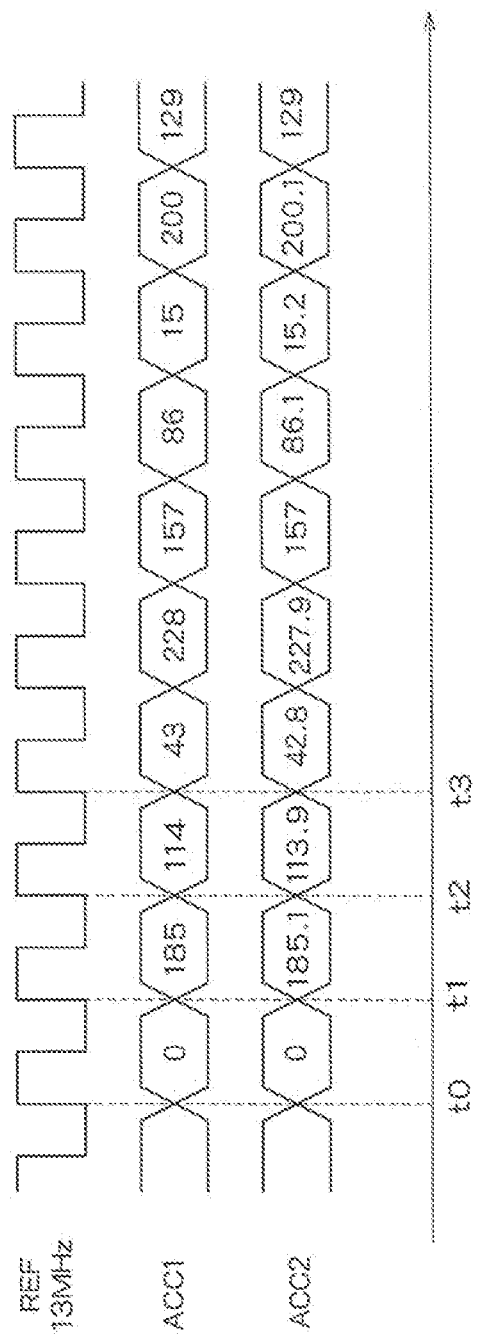
F I G. 4

SEMICONDUCTOR INTEGRATED CIRCUIT, RADIO COMMUNICATION DEVICE AND TIME TO DIGITAL CONVERTER

CROSS REFERENCE TO RELATED APPLICATIONS

This application is based upon and claims the benefit of priority from the prior Japanese Patent Application No. 2010-204695 filed on Sep. 13, 2010, the entire contents of which are incorporated herein by reference.

FIELD

Embodiments described herein relate generally to a semiconductor integrated circuit, a radio communication device and a time to digital converter.

BACKGROUND

A radio communication device represented by a cellular phone can include a PLL (Phase Lock Loop) circuit for generating a local oscillator (hereinafter referred to as LO) signal. In recent years, an ADPLL (All Digital Phase Lock Loop) circuit where whole processing is performed by digital circuits is often implemented.

In the ADPLL circuit, a time to digital converter (hereinafter referred to as TDC) for converting a phase difference between the generated LO signal and a reference signal outputted from the outside to a digital value is used. In a general conventional TDC, delay elements such as inverters are connected in series. However, the delay time may vary due to a variation of semiconductor manufacturing, process and so on. Therefore, it is necessary to normalize phase difference information by performing complex operations. As a result, there are problems that the volume of the PLL becomes large and the consumption power increases.

BRIEF DESCRIPTION OF THE DRAWINGS

FIG. 1 is a schematic block diagram of a radio communication device 100 according to one embodiment.

FIG. 2 is a schematic block diagram of a semiconductor integrated device 200.

FIG. 3 is a flowchart showing an example of the processing operation of the semiconductor integrated circuit 200 of FIG. 2.

FIG. 4 is a waveform showing an example of the reference signal REF, the signal ACC1 and the signal ACC2.

DETAILED DESCRIPTION

Figure 5:
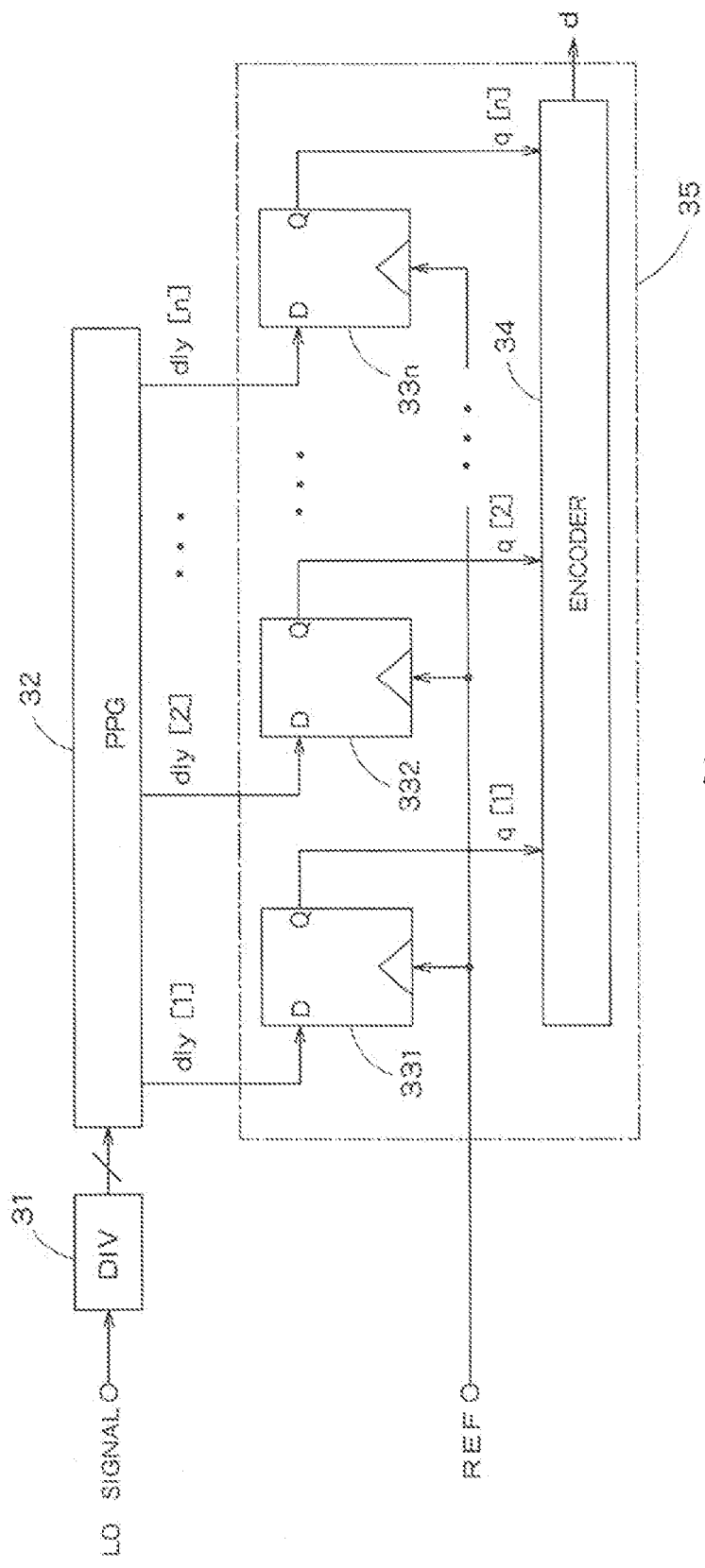
FIG. 5 is a schematic block diagram showing an example of the internal configuration of the TDC 24.

In general, according to one embodiment, a semiconductor integrated device includes a digitally controlled oscillator, a counter, a time to digital converter, an adder, and a control signal generator. The digitally controlled oscillator is configured to generate an oscillation signal having a frequency depending on a first digital signal. The counter is configured to count the number of pulses of the oscillation signal to output a counted value as a second digital signal in synchronization with a reference signal. The time to digital converter is configured to generate a third digital signal corresponding to a phase difference between the oscillation signal and the reference signal. The adder is configured to generate a fourth digital signal by adding the second digital signal to the third digital signal. The control signal generator is configured to generate the first digital signal based on a value obtained by accumulating a frequency command word in synchronization with the reference signal and the fourth digital signal in such a manner that the frequency of the oscillation signal approaches a predetermined frequency. The time to digital converter includes a frequency-divider, a plurality of impedance elements, and a phase difference detector. The frequency-divider is configured to frequency-divide the oscillation signal to generate a plurality of frequency-divided signals. The plurality of impedance elements is configured to voltage-divide the frequency-divided signals to generate a plurality of delay signals of the oscillation signal. The phase difference detector is configured to output the third digital signal corresponding to the phase difference between the reference signal and the oscillation signal by comparing the reference signal with each of the delay signals.

Embodiments will now be explained with reference to the accompanying drawings.

(First Embodiment)

FIG. 1 is a schematic block diagram of a radio communication device 100 according to one embodiment. The radio communication device 100 of FIG. 1 is mounted on a cellular phone, for example. The radio communication device 100 has an antenna 1, a switch (SW) 2, a signal transmitter 3 and a signal receiver 4. Note that, the radio communication device 100 may include only one of the signal transmitter 3 and the signal receiver 4.

The antenna 1 transmits or receives a radio signal. The switch 2 controls whether the antenna 1 transmits or receives the radio signal. The signal transmitter 3 processes an input radio signal inputted from a baseband LSI (Large Scale Integrated circuit) etc. (not shown), and outputs the processed radio signal to the antenna 1. The signal receiver 4 processes the radio signal received by the antenna 1, and outputs the processed signal to the outside.

The signal transmitter 3 has an input signal processing circuit 5, a first semiconductor integrated circuit 6, a modulation circuit 7 and a power amplifier (PA) 8. The input signal processing circuit 5 processes a signal inputted from the outside. The first semiconductor integrated circuit 6 generates an LO signal. Based on this LO signal, the modulation circuit 7 modulates the output signal from the input signal processing circuit 5. The power amplifier 8 amplifies the output signal from the modulation circuit 7, and outputs the amplified signal to the antenna 1.

The signal receiver 4 has an LNA (Low Noise Amplifier) 9, a second semiconductor integrated circuit 10, a demodulation circuit 11 and an output signal processing circuit 12. The LNA 9 amplifies the radio signal received by the antenna 1. The second integrated circuit 10 generates an LO signal. Based on this LO signal, the demodulation circuit 11 demodulates the radio signal amplified by the LNA 9. The output signal processing circuit 12 processes the demodulated signal and outputs the processed signal to the outside.

When the first and the second semiconductor integrated circuits 6 and 10 can generate the LO signals having low phase noise, it is possible to encode audio/video signals in a predetermined format to transmit them, or to decode signals received by the antenna 1 to reproduce original audio/video signals stably without error. Therefore, in the present embodiment, the LO signal is generated as follows.

FIG. 2 is a schematic block diagram of a semiconductor integrated device 200 capable of used as the first and the second semiconductor integrated circuits 6 and 10. A reference signal REF and a frequency command word FCW are inputted to the semiconductor integrated device 200. The reference signal REF is, for example, generated by a crystal (not shown). Although the frequency Fref of the reference signal REF is not so high (for example, 13 MHz), there is little phase noise therein.

The semiconductor integrated circuit 200 of FIG. 2 generates the LO signal having a frequency higher than the frequency Fref of the reference signal REF, more specifically, generates the LO signal having the frequency of Fref*FCW as a target frequency. The present embodiment shows an example where Fref=13 MHz, FCW=185, and the LO signal having the frequency Flo of 2405 MHz (=13 MHz*185, approximately 2.4 GHz) is generated. This frequency Flo is used in a certain radio communication.

The semiconductor integrated circuit 200 of FIG. 2 has a digitally controlled oscillator (hereinafter referred to as DCO) 21, a flip-flop (FF) 22, a counter 23, a TDC 24, an adder 25, an accumulator 26, and a control signal generator 27.

The DCO 21 generates the LO signal whose frequency depends on an oscillator tuning word OTW (first digital signal). The DCO 21 is implemented by controlling a plurality of varactor capacitors in two values. As the oscillator tuning word OTW is larger, the frequency Flo of the LO signal becomes lower.

The reference signal REF is inputted to a data terminal D of the flip-flop 22, and the LO signal is inputted to a clock terminal thereof. The flip-flop 22 holds the value of the reference signal REF in synchronization with the LO signal.

The counter 23 has an accumulator 23a. The LO signal is inputted to the accumulator 23a as a clock, and the accumulator 23a counts the number of the pulses of the LO signal. The output signal of the flip-flop 22 is inputted to the counter 23 as a clock. In synchronization with the output signal of the flip-flop 22, the counter 23 outputs the count value of the accumulator 23a as a signal CNTV (second digital signal).

The value of the signal CNTV corresponds to an integer part of a ratio Flo/Fref. For example, when the frequency Flo of the LO signal equals to the target frequency 2405 MHz, the accumulator 23a counts up by "1" at 2405 MHz, while the counter 23 outputs the count value of the accumulator 23a at Fref=13 MHz. Therefore, the value of the signal CNTV increases by "185" (=2405 MHz/13 MHz). The value of "185" equals to the frequency command word FCW. On the other hand, when the frequency Flo is higher (lower) than 2405 MHz, the value of the signal CNTV increases by a value larger (smaller) than "185".

The TDC 24 measures a phase difference between the LO signal and the reference signal Fref with an accuracy smaller than a cycle of the LO signal to output the measured value as a signal d (third digital signal). More specifically, the TDC 24 generates the signal d by comparing phases of a plurality of delay signals having delay times different from each other obtained by delaying the LO signal with the phase of the reference signal Fref. The signal d corresponds to a decimal part of the ratio Flo/Fref.

As described below, the TDC 24 of the present embodiment generates the delay signals not by serially-connected delay elements, but by generating a frequency-divided signal by a frequency divider and voltage-dividing the frequency-divided signal by resistances. Therefore, it is unnecessary to normalize variation of the delay elements, and thus, the signal d can be generated by a small size and low consumption power circuit.

The adder 25 adds the signal CNTV to the signal d and outputs the added value as a signal ACC2 (fourth digital signal). The signal ACC2 corresponds to the ratio Flo/Fref.

The reference signal REF is inputted to the accumulator 26 as a clock. The accumulator 26 accumulates the frequency command word FCW in synchronization with the reference signal REF to output the accumulated value as a signal ACC1. Therefore, the signal ACC increases by the frequency command word FCW in synchronization with the reference signal REF.

The control signal generator 27 has, for example, a subtractor 27a, a loop filter 27b and a multiplier 27c. The subtractor 27a outputs a difference value obtained by subtracting the value of the signal ACC2 from the value of the signal ACC1 to the loop filter 27b. The loop filter 27b smooths the difference value to remove the high-frequency component therefrom. The multiplier 27c multiplies the output value of the loop filter 27b by a predetermined coefficient K to output the oscillator tuning word OTW.

The control signal generator 27 controls the oscillator tuning word OTW so that the frequency Flo of the LO signal approaches the target frequency Fref*FCW based on the signals ACC1 and ACC2. More specifically, when the frequency Flo of the LO signal is higher (lower) than 2405 MHz, the signal ACC2 becomes larger (smaller) than the signal ACC1. Then, the control signal generator 27 controls the oscillator tuning word OTW so that the frequency Flo becomes lower (higher).

FIG. 3 is a flowchart showing an example of the processing operation of the semiconductor integrated circuit 200 of FIG. 2. Firstly, the counter 23 counts the number of the pulses of the LO signal in synchronization with the reference signal REF to generate the signal CNTV corresponding to the integer part of the ratio Flo/Fref (Step S1). Furthermore, the TDC 24 detects the phase difference between the LO signal and the reference signal REF to generate the signal d corresponding to the decimal part of the ratio Flo/Fref (Step S2).

Then, the control signal generator 27 generates the oscillator tuning word OTW based on the signal ACC1 obtained by accumulating the frequency command word FCW in synchronization with the reference signal REF and the signal ACC2 obtained by adding the integer part of the ratio Flo/Fref to the decimal part thereof. More specifically, when ACC1>ACC2, because the frequency Flo is lower than the target frequency FCW*Fref (Step S3—YES), the control signal generator 27 generates the frequency command word FCW so that the frequency of the LO signal generated by the DCO21 becomes higher (Step S4). On the other hand, when ACC1<ACC2, because the frequency Flo is higher than the target frequency FCW*Fref (Step S5—YES), the control signal generator 27 generates the frequency command word FCW so that the frequency of the LO signal generated by the DCO21 becomes lower (Step S6). Then, the DCO21 generates the LO signal whose frequency depends on the generated frequency command word FCW.

By repeating such a feedback operation, the LO signal is controlled in such a manner that the frequency Flo of the LO signal approaches the target frequency FCW*Fref.

FIG. 4 is a waveform showing an example of the reference signal REF, the signal ACC1 and the signal ACC2. Note that, FIG. 4 shows an example where both of the signals ACC1 and ACC2 have eight bits. Furthermore, although the signal ACC2 is a digital signal, the signal ACC2 is represented as a decimal value in order to simplify the explanation.

As shown in FIG. 4, the value of the signal ACC1 generated by the accumulator 26 increases by "185" which is a value of the frequency command word FCW in synchronization with the reference signal REF. For example, the value of the signal ACC1 is "0" at time t0, "185" at time t1 and "114" (="185"+ "185"–"256") at time t2, respectively.

On the other hand, as stated above, the signal ACC2 corresponds to the ratio Flo/Fref. For example, during time t1 to t2, the value of the signal ACC2 is "185.1", which is larger than the value of the signal ACC1 of "185". This means that the frequency Flo of the LO signal is slightly higher than the target frequency 2405 MHz. In this case, the control signal generator 27 generates the oscillator tuning word OTW so that the frequency of the LO signal becomes lower. Here, the integer part "185" of "185.1" is detected by the counter 23 and the decimal part "0.1" thereof is detected by the TDC 24.

Contrarily, during time t2 to t3, the value of the signal ACC2 is "113.9", which is smaller than the value of the signal ACC1 of "114". This means that the frequency Flo of the LO signal is slightly lower than the target frequency 2405 MHz. In this case, the control signal generator 27 generates the oscillator tuning word OTW so that the frequency of the LO signal becomes higher. Here, the integer part "113" of "113.9" is detected by the counter 23 and the decimal part "0.9" thereof is detected by the TDC 24.

Note that, because the loop filter 27b is included in the control signal generator 27, magnitude relationship between the signal ACC1 and the signal ACC2 is not reflected immediately.

Hereinafter, an internal configuration of the TDC 24, which is one of the characteristic features of the present embodiment, will be explained in detail. FIG. 5 is a schematic block diagram showing an example of the internal configuration of the TDC 24. The TDC 24 has a frequency-divider (DIV) 31, a passive phase generator (hereinafter referred to as PPG) 32, and a phase difference detector 35 having "n" flip-flops 331 to 33n (one of them is represented as flip-flop 33k) and an encoder 34.

The frequency-divider 31 generates four-phase frequency-divided signals LO1 to LO4 having phases different from each other by "90" degree, for example. The frequency-divider 31 is implemented by a quadrature VCO, a ring oscillator, or a polyphase filter, for example. Note that, the frequency divider 31 may generate not only four-phase frequency-divided signals but also eight- or sixteen-phase frequency-divided signals.

The PPG 32 further divides the four-phase frequency-divided signals LO1 to LO4 into "m" to generate 4*m(="n")-phase delay signals dly[1] to dly[n]. Note that, the delay signal dly[1] is the LO signal itself. Furthermore, the phase difference, namely, the delay time between the delay signals dly[1] to dly[n] and the delay signal dly[1] becomes larger in this order. An internal configuration of the PPG 32 will be explained below with reference to FIG. 7.

The phase difference detector 35 outputs the signal d by comparing the reference signal REF with each of the delay signals dly[1] to dly[n]. More specifically, the delay signal dly[k] is inputted to a data terminal D of the corresponding flip-flop 33k, and the reference signal REF is inputted to a clock terminal thereof. The flip-flop 33k holds the value of the delay signal dly[k] in synchronization with the reference signal REF to output the hold value as the signal q[k]. Furthermore, the encoder 34 generates the signal d indicative of the phase difference between the LO signal and the reference signal REF to output it based on the signals q[1] to q[n].

Figure 6:
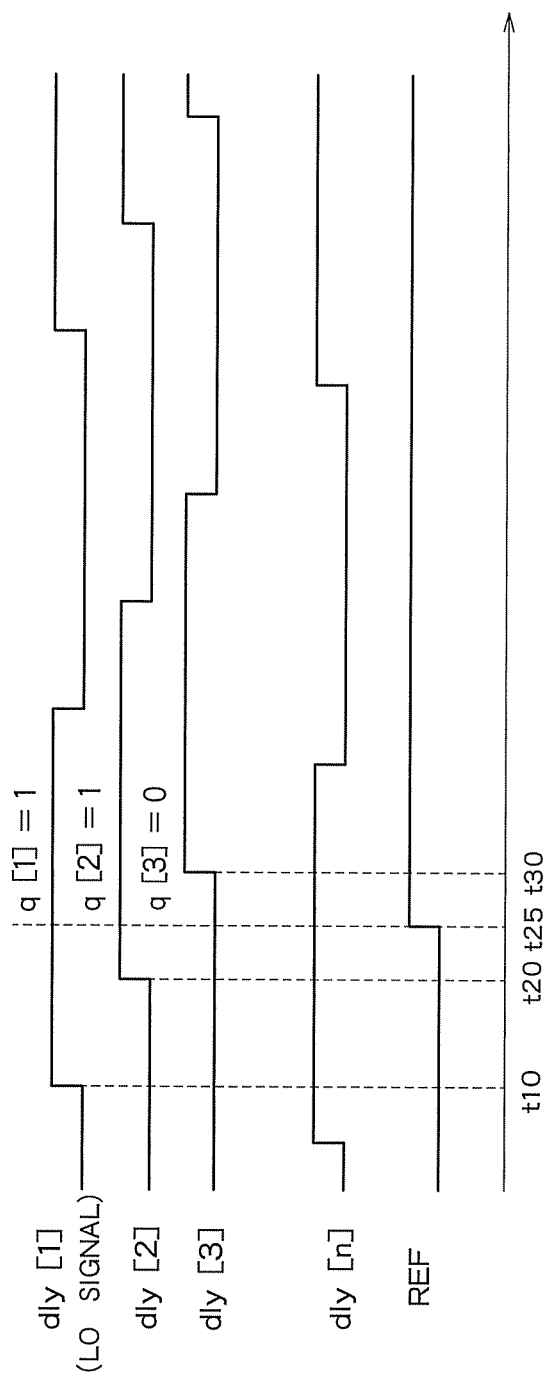
FIG. 6 is a waveform showing an example of the delay signals dly[1] to dly[n] and the reference signal REF.

FIG. 6 is a waveform showing an example of the delay signals dly[1] to dly[n] and the reference signal REF. In FIG. 6, the delay signal dly[1], namely, the LO signal rises up at time t10, and subsequently, the delay signals dly[2] and dly[3] rise up at time t20 and time t30, respectively.

Here, it is assumed that the reference signal REF rises up at time t25 which is between time t20 and time t30, the flip-flop 331 to 33n hold the values of the delay signals dly[1] to dly[n] as the signals q[1] to q[n] at time t25, respectively. As a result, the signal q[2] is set to be high, and the signal q[3] is set to be low. The encoder 34 detects that the value switches from high to low at between the signal q[2] and the signal q[3], based on which, the encoder 34 outputs the signal d indicative of the phase difference between the LO signal and the reference signal REF.

Figure 7:
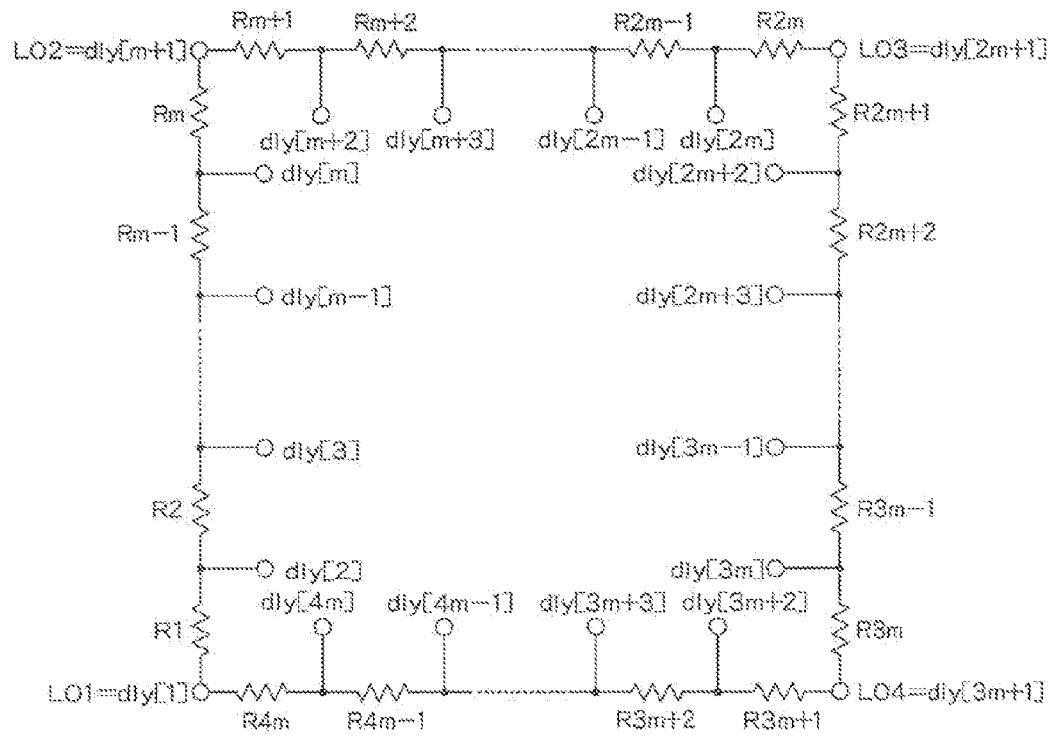
FIG. 7 is a circuit configuration showing an internal configuration of the PPG 32.

FIG. 7 is a circuit configuration showing an internal configuration of the PPG 32. The PPG 32 of FIG. 7 generates the delay signals dly[1] to dly[4 m] by further dividing the four frequency-divided signals LO1 to LO4 generated by the frequency-divider 31 of FIG. 5 into "m".

The PPG 32 has "4m" resistances R1 to R4m. The resistances R1 to Rm are connected in series between the frequency-divided signal LO1 and the frequency-divided signal LO2. The resistances Rm+1 to R2m are connected in series between the frequency-divided signal LO2 and the frequency-divided signal LO3. The resistances R2m+1 to R3m are connected in series between the frequency-divided signal LO3 and the frequency-divided signal LO4. The resistances R3m+1 to R4m are connected in series between the frequency-divided signal LO4 and the frequency-divided signal LO1. Here, it is preferable that the delay times of the delay signals dly[1] to dly[4 m] are set at regular intervals in order to reduce spurious component outputted from the semiconductor integrated circuit 200. Therefore, it is preferable that the resistance value becomes larger as the resistance is connected closer to the frequency-divided signal. For example, R1>R2>...<Rm−1<Rm.

The delay signal dly[k+1] is outputted from the connection node of the resistance Rk (k="1" to 4m−1) and the resistance Rk+1, and the delay signal dly[1] is outputted from the connection node of the resistance R4m and the resistance R1. For example, the delay signal dly[2] is obtained by dividing the voltage of the frequency-divided signals LO1 and LO2 by the resistances R1 to Rm. The delay time of the delay signal dly[2] obtained by the voltage division has a value between the delay time of the frequency-divided signal LO1 and the delay time of the frequency-divided signal LO2. The other delay signals are similarly arranged.

Note that, each of the following pairs shows the same signal: the frequency-divided signal LO1 and the delay signal dly[1]; LO2 and dly[m+1]; LO3 and dly[2m+1]; and LO4 and dly[3m+1].

By appropriately setting the resistance values of the resistances R1 to R4m, the delay times of the delay signals dly[1] to dly[4 m] can be set at regular intervals.

Figure 8:
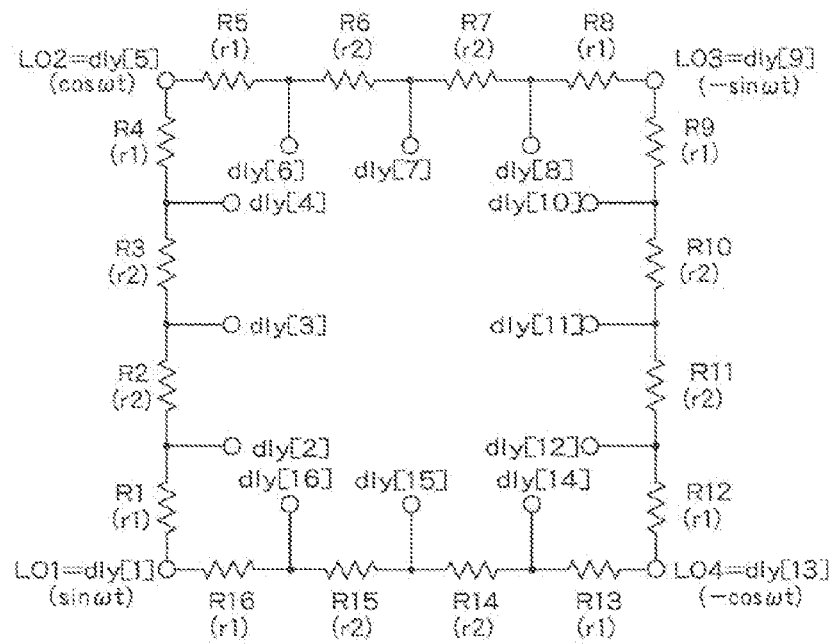
FIG. 8 is a circuit configuration showing a specific example of the PPG 32.

FIG. 8 is a circuit configuration showing a specific example of the PPG 32. The PPG 32 of FIG. 8 is an example where m=4 in the PPG 32 of FIG. 7. Hereinafter, conditions required for the PPG 32 of FIG. 8 will be obtain in order to set the delay times of the delay signals dly[1] to dly[16] at regular intervals.

The resistance values of the resistances R1 to R16 must be symmetrically set between two arbitrary frequency-divided signals. Therefore, the resistance value of eight resistances closest to the frequency-divided signals is defined as r1, and the resistance value of the other resistances is defined as r2.

Further, because the LO signal and the frequency-divided signals LO1 to LO4 generated therefrom have a high frequency of about 2.4 GHz, the waveform can be approximated not by a rectangle but by a sine wave. Additionally, considering that the frequency-divided signals LO1 to LO4 have phases different from each other by "90" degrees, the following equations (1) to (4) can be established.

$$LO1 = \sin \omega t \quad (1)$$

$$LO2 = \cos \omega t \quad (2)$$

$$LO3 = -\sin \omega t \quad (3)$$

$$LO4 = -\cos \omega t \quad (4)$$

Here, $\omega = 2\pi \ast Flo$. For example, the delay signals dly[2] to dly[4] have a voltage obtained by dividing the voltage of the frequency-divided signals LO1 and LO2 by the resistances R1 to R4. Accordingly, dly[1] to dly[5] can be expressed by the following equations (5) to (9).

$$dly[1] = \sin \omega t \quad (5)$$

$$dly[2] = \frac{r1+2r2}{2r1+2r2}\sin\omega t + \frac{r1}{2r1+2r2}\cos\omega t = A\sin(\omega t + \alpha) \quad (6)$$

$$dly[3] = \frac{1}{2}\sin\omega t + \frac{1}{2}\cos\omega t = \frac{1}{\sqrt{2}}\sin(\omega t + 45) \quad (7)$$

$$dly[4] = \frac{r1}{2r1+2r2}\sin\omega t + \frac{r1+2r2}{2r1+2r2}\cos\omega t = A\sin(\omega t + \beta) \quad (8)$$

$$dly[5] = \cos\omega t = \sin(\omega t + 90) \quad (9)$$

Here, A, $\alpha$, and $\beta$ can be expressed by the following equations (10) to (12).

$$A = \sqrt{\left(\frac{r1+2r2}{2r1+2r2}\right)^2 + \left(\frac{r1}{2r1+2r2}\right)^2} \quad (10)$$

$$\alpha = \arctan\frac{r1}{2r1+2r2} \quad (11)$$

$$\beta = \arctan\frac{r1+2r2}{r1} \quad (12)$$

Then, the resistance values r1 and r2 are set to satisfy the following equation (13).

$$r1 = \sqrt{2} \ast r2 \quad (13)$$

Accordingly, $\alpha = 22.5$ degrees and $\beta = 67.5$ degrees, by which the delay signals dly[1] to dly[5] can have phases shifted from each other by "22.5" degrees. As a result, the delay signals dly[1] to dly[16] have phases different from each other by 360/16 degrees, and the delay times are set at regular intervals. Therefore, the spurious component outputted from the semiconductor integrated circuit 200 can be reduced.

As stated above, the TDC 24 according to the present embodiment firstly generates a plurality of frequency-divided signals by frequency-dividing the LO signal by the frequency-divider 31. Then, the delay signals of the LO signal are generated by voltage-dividing the frequency-divided signals by a plurality of resistances. Therefore, it is unnecessary to normalize the phase difference information by complex operations. Accordingly, the circuit for normalizing is not needed, thereby downsizing the volume of the circuit and reducing the consumption power. Further, because the normalizing operation is not needed, it is possible to shorten the delay time of the feedback loop. As a result, Fref*FCW can be set to be a value equal to or more than 100 MHz to generate the LO signal (oscillation signal) having a high frequency (for example, 2.4 GHz). Furthermore, by adjusting the resistances in the TDC 24, the delay times of the delay signals can be set at regular intervals.

In FIGS. 7 and 8, the resistances may be replaced by general impedance elements such as capacitors, inductors, and transistors the gate of which is biased to a predetermined potential.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor integrated device comprising:
   a digitally controlled oscillator configured to generate an oscillation signal having a frequency depending on a first digital signal;
   a counter configured to count the number of pulses of the oscillation signal to output a counted value as a second digital signal in synchronization with a reference signal;
   a time to digital converter configured to generate a third digital signal corresponding to a phase difference between the oscillation signal and the reference signal;
   an adder configured to generate a fourth digital signal by adding the second digital signal to the third digital signal; and
   a control signal generator configured to generate the first digital signal based on a value obtained by accumulating a frequency command word in synchronization with the reference signal and the fourth digital signal in such a manner that the frequency of the oscillation signal approaches a predetermined frequency,
   wherein the time to digital converter is configured to comprise:
   a frequency-divider configured to frequency-divide the oscillation signal to generate a plurality of frequency-divided signals;
   a plurality of impedance elements configured to voltage-divide the frequency-divided signals to generate a plurality of delay signals of the oscillation signal; and
   a phase difference detector configured to output the third digital signal corresponding to the phase difference between the reference signal and the oscillation signal by comparing the reference signal with each of the delay signals.

2. The circuit of claim 1, wherein the frequency-divider is configured to frequency-divide the oscillation signal into k (k is an integer) to generate first to k-th frequency-divided signals,
   the plurality of impedance elements are connected between the I-th (I is an integer of "1" to (k−1)) frequency-divided signal and the (I+1)-th frequency-divided signal in series, and between the k-th frequency-divided signal and the first frequency-divided signal in series, respectively, and
   the delay signals are outputted from connection nodes of the impedance elements.

3. The circuit of claim 2, wherein a resistance value of a first impedance element among the impedance elements is larger than a resistance value of a second impedance element among the impedance elements, the first impedance element being arranged closer to the frequency-divided signals than the second impedance element.

4. The circuit of claim 1, wherein impedance values of the impedance elements are set in such a manner that delay times of the delay signals are set at regular intervals.

5. The circuit of claim 1, wherein the frequency of the oscillation signal is equal to or more than 100 MHz.

6. The circuit of claim 1, wherein the frequency-divider is configured to generate first to fourth frequency-divided signals having phases different from each other by "90" degrees,
the impedance elements comprise first to fourth impedance elements connected in series between the k-th ("k" is an integer of "1" to "3") frequency-divided signal and the (k+1)-th frequency-divided signal in series, and between the fourth frequency-divided signal and the first frequency-divided signal in series, respectively, and
a following equation (1) is satisfied, $$r1=\sqrt{2}*r2 \qquad (1)$$

where r1 is an impedance value of the first and the fourth impedance elements, and r2 is an impedance value of the second and the third impedance elements.

7. The circuit of claim 6, wherein the frequency-divider is a quadrature VCO, a ring oscillator, or a polyphase filter.

8. The circuit of claim 1, wherein each of the impedance elements is a resistance, a capacitor, an inductor, or a transistor having a gate biased to a predetermined potential.

9. A radio communication device comprising at least one of a signal transmitter and a signal receiver,
wherein the signal transmitter is configured to comprise a first semiconductor integrated circuit, and configured to modulate an input signal inputted from an outside based on a oscillation signal generated by the first semiconductor integrated circuit to transmit a modulated input signal to an antenna; and
the signal receiver is configured to comprise a second semiconductor integrated circuit, and configured to demodulate a received signal received by the antenna based on a oscillation signal generated by the second integrated semiconductor circuit to output the demodulated received signal to the outside,
wherein each of the first and the second integrated circuits are configured to comprises:
a digitally controlled oscillator configured to generate an oscillation signal having a frequency depending on a first digital signal;
a counter configured to count the number of pulses of the oscillation signal to output a counted value as a second digital signal in synchronization with a reference signal;
a time to digital converter configured to generate a third digital signal corresponding to a phase difference between the oscillation signal and the reference signal;
an adder configured to generate a fourth digital signal by adding the second digital signal to the third digital signal; and
a control signal generator configured to generate the first digital signal based on a value obtained by accumulating a frequency command word in synchronization with the reference signal and the fourth digital signal in such a manner that the frequency of the oscillation signal approaches a predetermined frequency,
wherein the time to digital converter is configured to comprise:
a frequency-divider configured to frequency-divide the oscillation signal to generate a plurality of frequency-divided signals;
a plurality of impedance elements configured to voltage-divide the frequency-divided signals to generate a plurality of delay signals of the oscillation signal; and
a phase difference detector configured to output the third digital signal corresponding to the phase difference between the reference signal and the oscillation signal by comparing the reference signal with each of the delay signals.

10. The device of claim 9, wherein the frequency-divider is configured to frequency-divide the oscillation signal into k (k is an integer) to generate first to k-th frequency-divided signals,
the plurality of impedance elements are connected between the l-th (l is an integer of "1" to (k+1)) frequency-divided signal and the (l+1)-th frequency-divided signal in series, and between the k-th frequency-divided signal and the first frequency-divided signal in series, respectively, and
the delay signals are outputted from connection nodes of the impedance elements.

11. The device of claim 10, wherein a resistance value of a first impedance element among the impedance elements is larger than a resistance value of a second impedance element among the impedance elements, the first impedance element being arranged closer to the frequency-divided signals than the second impedance element.

12. The device of claim 9, wherein impedance values of the impedance elements are set in such a manner that delay times of the delay signals are set at regular intervals.

13. The device of claim 9, wherein the frequency of the oscillation signal is equal to or more than 100 MHz.

14. The device of claim 9, wherein the frequency-divider is configured to generate first to fourth frequency-divided signals having phases different from each other by "90" degrees,
the impedance elements comprise first to fourth impedance elements connected in series between the k-th ("k" is an integer of "1" to "3") frequency-divided signal and the (k+1)-th frequency-divided signal in series, and between the fourth frequency-divided signal and the first frequency-divided signal in series, respectively, and
a following equation (1) is satisfied, $$r1=\sqrt{2}*r2 \qquad (1)$$

where r1 is an impedance value of the first and the fourth impedance elements, and r2 is an impedance value of the second and the third impedance elements.

15. The device of claim 14, wherein the frequency-divider is a quadrature VCO, a ring oscillator, or a polyphase filter.

16. The device of claim 14, wherein each of the impedance elements is a resistance, a capacitor, an inductor, or a transistor having a gate biased to a predetermined potential.

* * * * *